United States Patent
Duong et al.

(10) Patent No.: US 10,008,927 B2
(45) Date of Patent: Jun. 26, 2018

(54) REGULATOR CIRCUIT FOR REDUCING OUTPUT RIPPLE

(71) Applicant: SAMSUNG ELECTRONICS CO., LTD., Suwon-si, Gyeonggi-do (KR)

(72) Inventors: Hoang Quoc Duong, Seoul (KR); Hyun-Seok Shin, Suwon-si (KR); Jun-Hyun Bae, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 25 days.

(21) Appl. No.: 15/221,629

(22) Filed: Jul. 28, 2016

(65) Prior Publication Data

US 2017/0126118 A1    May 4, 2017

(30) Foreign Application Priority Data

Oct. 29, 2015  (KR) .......................... 10-2015-0150846

(51) Int. Cl.
| | |
|---|---|
| *H02M 3/155* | (2006.01) |
| *H02M 1/08* | (2006.01) |
| *H02M 1/14* | (2006.01) |
| *H03F 3/45* | (2006.01) |

(52) U.S. Cl.
CPC ............. *H02M 3/155* (2013.01); *H02M 1/08* (2013.01); *H02M 1/143* (2013.01); *H03F 3/45076* (2013.01); *H03F 2203/45116* (2013.01)

(58) Field of Classification Search
None
See application file for complete search history.

(56) References Cited

U.S. PATENT DOCUMENTS

| 5,668,464 | A | * | 9/1997 | Krein ...................... G05F 1/565 323/259 |
|---|---|---|---|---|
| 6,703,815 | B2 | | 3/2004 | Biagi |
| 7,091,710 | B2 | | 8/2006 | Yang et al. |
| 7,948,720 | B2 | | 5/2011 | Mok et al. |
| 7,956,588 | B2 | | 6/2011 | Imura |
| 8,344,713 | B2 | | 1/2013 | Shrivas et al. |
| 8,378,652 | B2 | | 2/2013 | Xie |
| 8,680,828 | B2 | | 3/2014 | Heng |

(Continued)

FOREIGN PATENT DOCUMENTS

| JP | 2008-262327 A | 10/2008 |
|---|---|---|
| KR | 0924293 B | 10/2009 |

*Primary Examiner* — Jeffrey Gblende
(74) *Attorney, Agent, or Firm* — Volentine, Whitt & Francos, PLLC

(57) ABSTRACT

A regulator circuit includes an operational amplifier, a buffer, a power transistor, a first feedback circuit, a current sensor, and second feedback circuit. The operational amplifier drives a first node with a first voltage generated by amplifying a difference between an input voltage and a feedback voltage. The buffer drives a second node with a second voltage generated by buffering the first voltage. The power transistor has a drain receiving a supply voltage, a gate connected to the second node, and a source connected to a third node. The current sensor generates a first sensing current based on the second voltage. The second feedback circuit generates a plurality of feedback currents corresponding to a ripple of the output voltage and enhances a speed at which the ripple is reduced by providing at least one of the plurality of feedback currents to the third node.

19 Claims, 17 Drawing Sheets

(56) References Cited

U.S. PATENT DOCUMENTS

| | | | |
|---|---|---|---|
| 8,860,389 B2 | 10/2014 | Gakhar et al. | |
| 8,957,659 B2 | 2/2015 | Fujimura et al. | |
| 2008/0205095 A1* | 8/2008 | Pinon | H02M 3/1584 363/39 |
| 2009/0243580 A1* | 10/2009 | Chen | H02M 3/156 323/288 |
| 2010/0019749 A1* | 1/2010 | Katsuya | H02M 1/15 323/282 |
| 2013/0119954 A1 | 5/2013 | Lo | |
| 2014/0285165 A1 | 9/2014 | Wang et al. | |
| 2014/0340058 A1* | 11/2014 | Wang | H02M 1/15 323/268 |
| 2014/0347027 A1* | 11/2014 | Jayaraj | H02M 3/1563 323/282 |

* cited by examiner

REGULATOR CIRCUIT FOR REDUCING OUTPUT RIPPLE

CROSS-REFERENCE TO RELATED APPLICATION

This U.S. non-provisional application claims priority under 35 USC § 119 to Korean Patent Application No. 10-2015-0150846, filed on Oct. 29, 2015, in the Korean Intellectual Property Office (KIPO), the disclosure of which is incorporated by reference in its entirety herein.

BACKGROUND

1. Technical Field

Example embodiments relate generally to a regulator circuit, and more particularly to a regulator circuit capable of enhancing performance.

2. Discussion of the Related Art

Regulators, which are utilized as voltage sources in a wide variety of electronic circuits, are generally designed to generate a desired output voltage signal irrespective of variations in input voltage signal. The regulators typically include a power transistor which drives an output load of the electronic device.

Recently, as the power consumption of electronic circuits increases, a size and gate capacitance of the power transistor increases as well. This can be problematical in that the relatively large gate capacitance increases the time needed to remove ripple from the output voltage. In addition, a resonance phenomenon occurs in the output voltage, which degrades a performance of the regulator.

SUMMARY

Some example embodiments provide a regulator circuit capable of enhancing the speed at which a ripple of an output voltage is reduced and capable of suppressing a resonance phenomenon in the output voltage.

According to example embodiments, a regulator circuit includes an operational amplifier, a buffer, a power transistor, a first feedback circuit, a current sensor, a second feedback circuit and a stabilizer. The operational amplifier drives a first node with a first voltage generated by amplifying a difference between an input voltage and a feedback voltage. The buffer drives a second node with a second voltage generated by buffering the first voltage. The power transistor has a drain receiving a supply voltage, a gate connected to the second node, and a source connected to a third node. The current sensor generates a first sensing current based on the second voltage. The second feedback circuit generates first through fourth feedback currents corresponding to a ripple of the output voltage, provides the first current and the second feedback current to the first node and the second node respectively, and enhances a speed at which the ripple is reduced by providing the fourth feedback current to the third node. The stabilizer suppresses a resonance phenomenon of the output voltage based on an added current generated by adding the third feedback current and the first sensing current.

According to some example embodiments, a regulator circuit includes an operational amplifier, a buffer, a power transistor, a first feedback circuit, a current sensor, a second feedback circuit and a third feedback circuit. The operational amplifier drives a first node with a first voltage generated by amplifying a difference between an input voltage and a feedback voltage. The buffer drives a second node with a second voltage generated by buffering the first voltage. The power transistor has a drain receiving a supply voltage, a gate connected to the second node, and a source connected to a third node. The current sensor generates a first sensing current based on the second voltage. The second feedback circuit generates first through third feedback currents corresponding to a ripple of the output voltage, provides the first and second feedback currents to the first and second nodes, respectively, and enhances a speed at which the ripple is reduced by providing the third feedback current to the third node. The third feedback circuit generates a bias current based on the first voltage and the first sensing current and provides the bias current to the operational amplifier, the buffer, and the second feedback circuit.

According to some example embodiments, a regulator circuit includes an operational amplifier, a buffer, a power transistor, a first feedback circuit, a current sensor, and second feedback circuit. The operational amplifier drives a first node with a first voltage generated by amplifying a difference between an input voltage and a feedback voltage. The buffer drives a second node with a second voltage generated by buffering the first voltage. The power transistor has a drain receiving a supply voltage, a gate connected to the second node, and a source connected to a third node. The current sensor generates a first sensing current based on the second voltage. The second feedback circuit generates a plurality of feedback currents corresponding to a ripple of the output voltage and enhances a speed at which the ripple is reduced by providing at least one of the plurality of feedback currents to the third node.

According to some example embodiments, a regulator circuit includes an operational amplifier that generates a first voltage by amplifying a difference between an input voltage and a feedback voltage. A feedback circuit generates a biasing current based on the first voltage generated by the operational amplifier and applies the biasing current to the operational amplifier to current bias the operational amplifier. An undershoot condition of voltage ripple in the output of the regulator circuit causes the feedback circuit to increase the biasing current applied to the operational amplifier.

As described above, the regulator circuit may enhance a speed at which ripple of an output voltage is reduced by providing feedback currents to nodes of the regulator and may suppress a resonance phenomenon of the output voltage by a zero generated by a stabilizer moving fast toward a changed pole when a pole generated by a load is changed.

BRIEF DESCRIPTION OF THE DRAWINGS

Example embodiments of the disclosure will be more clearly understood from the following detailed description taken in conjunction with the accompanying drawings.

DETAILED DESCRIPTION OF THE EMBODIMENTS

Figure 1:
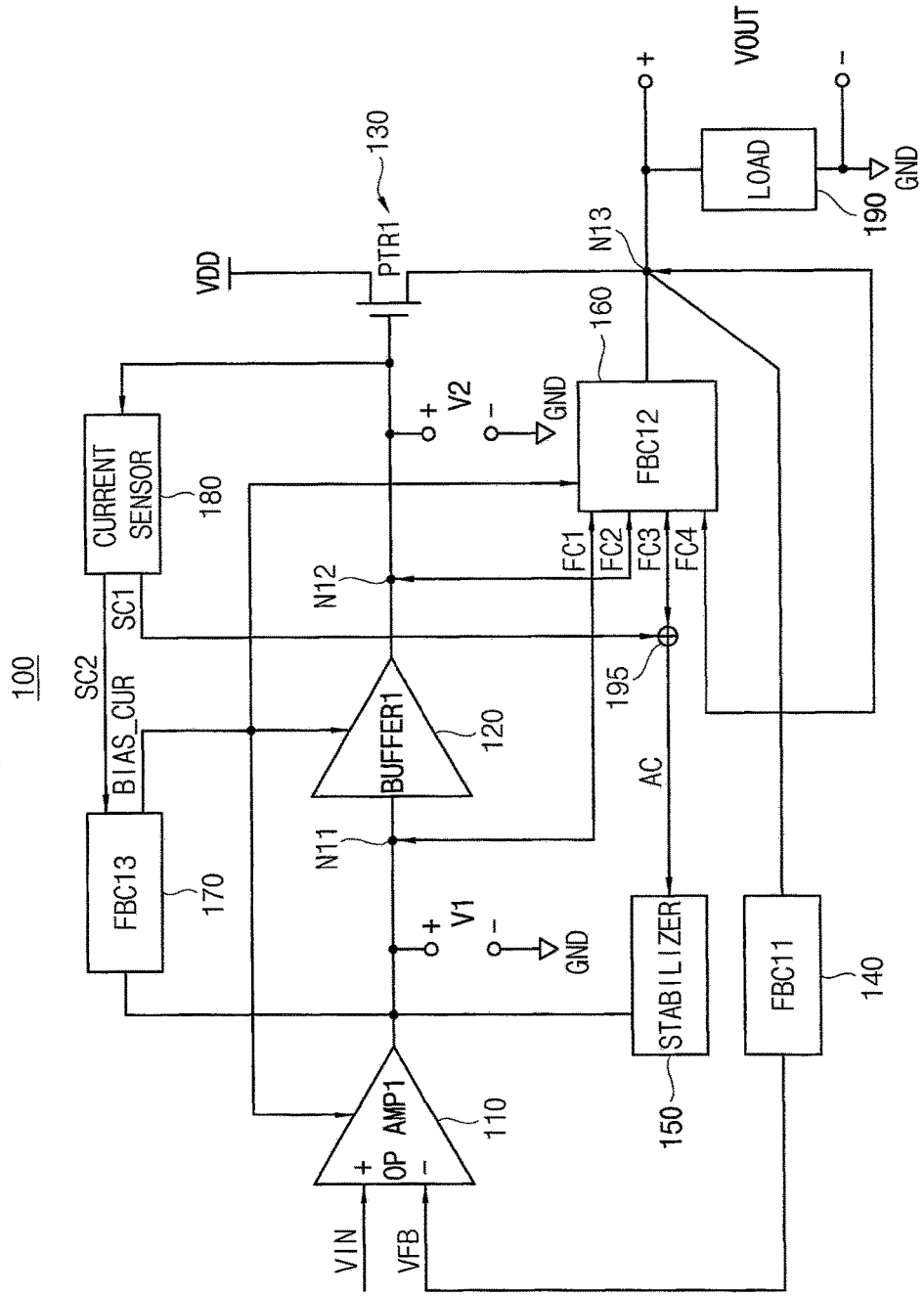
FIG. 1 is a block diagram illustrating a regulator circuit according to some example embodiments.

Various example embodiments will be described more fully hereinafter with reference to the accompanying drawings, in which some example embodiments are shown. The present disclosure may, however, be embodied in many different forms and should not be construed as limited to the example embodiments set forth herein. Rather, these example embodiments are provided so that this disclosure will be thorough and complete and will fully convey the scope of the present disclosure to those skilled in the art. In the drawings, the sizes and relative sizes of layers and regions may be exaggerated for clarity. Like numerals refer to like elements throughout.

FIG. 1 is a block diagram illustrating a regulator circuit according to some example embodiments.

Referring to FIG. 1, a regulator circuit 100 includes an operational amplifier 110, a buffer 120, a power transistor 130, a first feedback circuit 140, a current sensor 180, a second feedback circuit 160, and a stabilizer 150.

The operational amplifier 110 drives a first node N11 with a first voltage V1 generated by amplifying a difference between VIN and a feedback voltage VFB. The buffer 120 drives a second node N12 with a second voltage V2 generated by buffering the first voltage V1. The power transistor 130 includes a drain receiving a supply voltage VDD, a gate connected to the second node N12, and a source connected to a third node N13. The power transistor 130 may be implemented with NMOS transistor. Because the operational amplifier 110, the buffer 120, and the power transistor 130 are general circuits that are well-known to the ordinary skilled artisan, a detailed internal description the operational amplifier 100, the buffer 120, and the power transistor 130 is omitted herein.

The first feedback circuit 140 generates the feedback voltage VFB by voltage dividing an output voltage VOUT of the third node N13. The current sensor 180 generates a first sensing current SC1 based on the second voltage V2. The second feedback circuit 160 generates first through fourth feedback currents FC1, FC2, FC3, and FC4 corresponding to a ripple of the output voltage VOUT. The second feedback circuit 160 provides the first and second feedback currents FC1 and FC2 to the first and second nodes N11 and N12 respectively. The second feedback circuit 160 enhances a speed at which the ripple is reduced by providing the fourth feedback current FC4 to the third node N13. The stabilizer 150 suppresses a resonance phenomenon in the output voltage VOUT based on an added current AC generated by adding the third feedback current FC3 and the first sensing current SC1 with an adder 195. The first feedback circuit 140 will be described with reference to FIG. 17, the current sensor 180 will be described with reference to FIG. 9, the second feedback circuit 160 will be described with references to FIGS. 12 through 15, and the stabilizer 150 will be described with reference to FIG. 2.

The regulator circuit 100 may further include a load 190. A first terminal of the load 190 may be connected to the third node N13 and a second terminal of the load 190 may be connected to a ground voltage GND.

Figure 2:
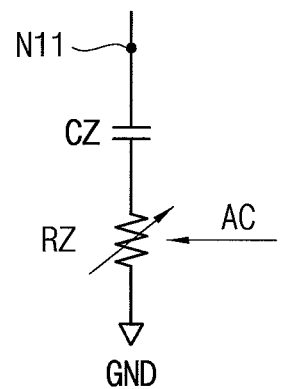
FIG. 2 is a circuit diagram illustrating the stabilizer in the regulator circuit of FIG. 1 according to example embodiments.

FIG. 2 is a circuit diagram illustrating the stabilizer in the regulator circuit of FIG. 1 according to example embodiments.

Referring to FIG. 2, the stabilizer 150 may include a resistor RZ and a capacitor CZ. A first terminal of the capacitor CZ may be connected to the first node N11, a second terminal of the capacitor CZ may be connected to a first terminal of the resistor RZ, and a second terminal of the resistor RZ may be connected to the ground voltage GND. A resistance of the resistor RZ may be changed based on the added current AC.

The stabilizer 150 may provide a zero corresponding to the resistor RZ and the capacitor CZ to the regulator circuit 100. When the resistance of the resistor RZ is changed by the added current AC, the zero may be changed to the value corresponding to the resistor RZ.

Figure 3:
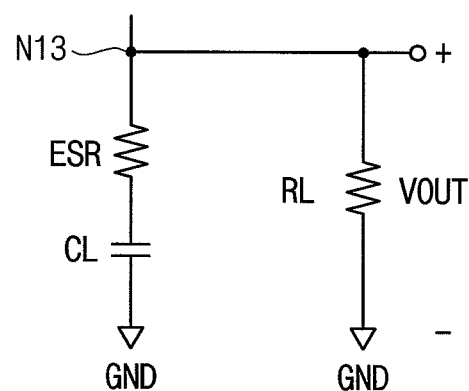
FIG. 3 is a circuit diagram illustrating the load included in the regulator circuit of FIG. 1.

FIG. 3 is a circuit diagram illustrating the load included in the regulator circuit of FIG. 1.

Referring to FIG. 3, the load 190 represents an equivalent circuit of a general load. The load 150 may include a load capacitor CL, a parasitic resistor ESR of the load capacitor CL, and a load resistor RL. A first terminal of the parasitic resistor ESR is connected to the third node N13, a second terminal of the parasitic resistor ESR is connected to a first terminal of the load capacitor CL, and a second terminal of the load capacitor CL is connected to the ground voltage GND. A first terminal of the load resistor RL is connected to the third node N13, and a second terminal of the load resistor RL is connected to the ground voltage GND. The load 190 may be implemented with a structure other than the structure of FIG. 3.

FIGS. 4 through 6A are graphs illustrating operation of the regulator circuit of FIG. 1.

Referring to FIGS. 1 through 3, the regulator circuit 100 includes a zero Z1 and three dominant poles P1, P2, and P3. The zero Z1 is determined by the resistor RZ and the capacitor CZ included in the stabilizer 150. The first dominant pole P1 is determined by an output resistance of the operational amplifier 110, a parasitic capacitance at the output of operational amplifier 110, and an input parasitic capacitance of the buffer 120. The second dominant pole P2 is determined by the first resistor RD1 and the second resistor RD2 included in the first feedback circuit 140 (See FIG. 17), an output resistance of the source of the power transistor 130, and the load capacitor CL. The third dominant pole P3 is determined by an output resistance of the buffer 120, a gate input capacitance of the power transistor 130, and a parasitic capacitance from the output of the buffer 120.

Figure 4:
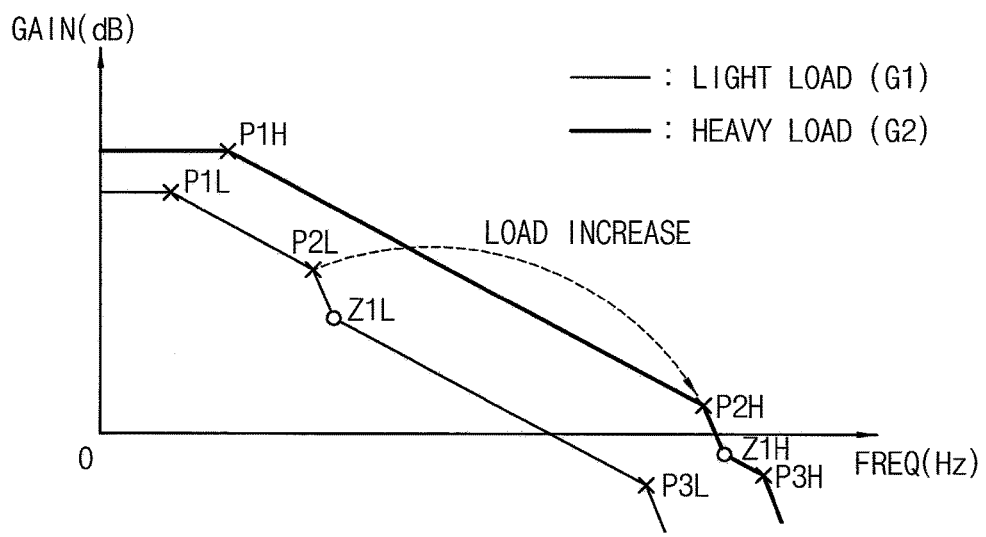
FIG. 4 illustrates gain as a function of frequency of the regulator circuit of FIG. 1 for a light load case and a heavy load case.

Referring to FIG. 4, a first graph G1 represents a frequency characteristic curve of the regulator circuit 100 when the load 190 is light (LIGHT LOAD), and a second graph G2 represents a frequency characteristic curve of the regulator circuit 100 when the load 190 is heavy (HEAVY LOAD).

FIG. 4 illustrates a gain as a function of frequency of the regulator circuit 100 of FIG. 1 for a light load case and a heavy load case.

In the light load case as depicted by the first graph G1, a second light-load dominant pole P2L (in other words, load pole) is close to a first light-load dominant pole P1L. However, a light-load zero Z1L chases a second light-load dominant pole P2L as Z1H for gain compensation in order to stabilize the regulator circuit 100. In the heavy load case as depicted by the second graph G2, the second light-load dominant pole P2L moves to a second heavy-load dominant pole P2H. However, a light-load zero Z1L also moves together with the second light-load dominant pole P2L such that the regulator circuit 100 is stable. In addition, the third dominant pole P3 also moves, from P3L to P3H, depending on load current.

When the load 190 becomes heavier, the frequency characteristic curve of the regulator circuit 100 moves from the first graph G1 to the second graph G2.

Figure 5:
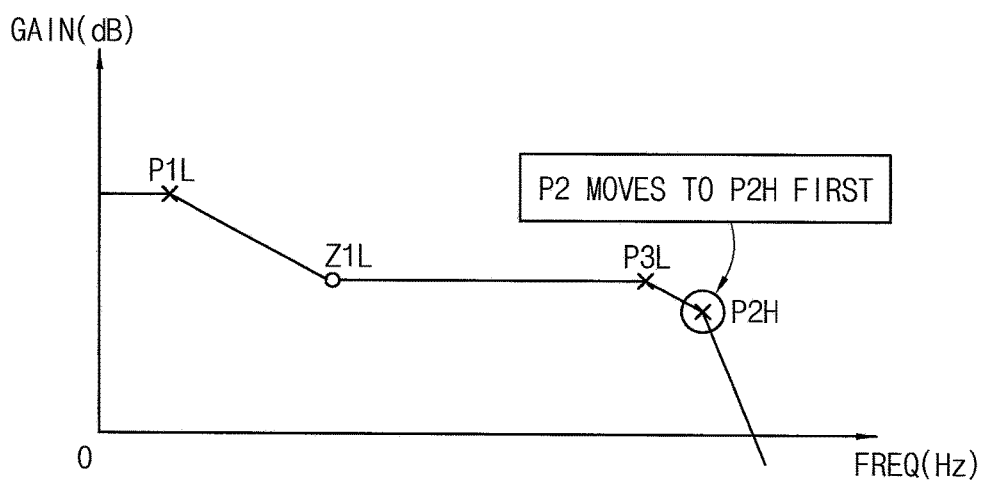
FIG. 5 represents a case when an output load current of the regulator circuit rapidly increases.

FIG. 5 represents a case when an output load current of the regulator circuit 100 rapidly increases because the load 190 moves rapidly from the light load to the heavy load.

In this case, due to a slow response of the current sensor 180, the zero Z1 and the third dominant pole P3 move slowly. Consequently, the regulator circuit 100 includes three dominant poles P1L, P3L, and P2H and the light-load zero Z1L as depicted in FIG. 5, which makes the regulator circuit 100 unstable. Consequently, the ripple is in an undershoot condition.

Figure 6:
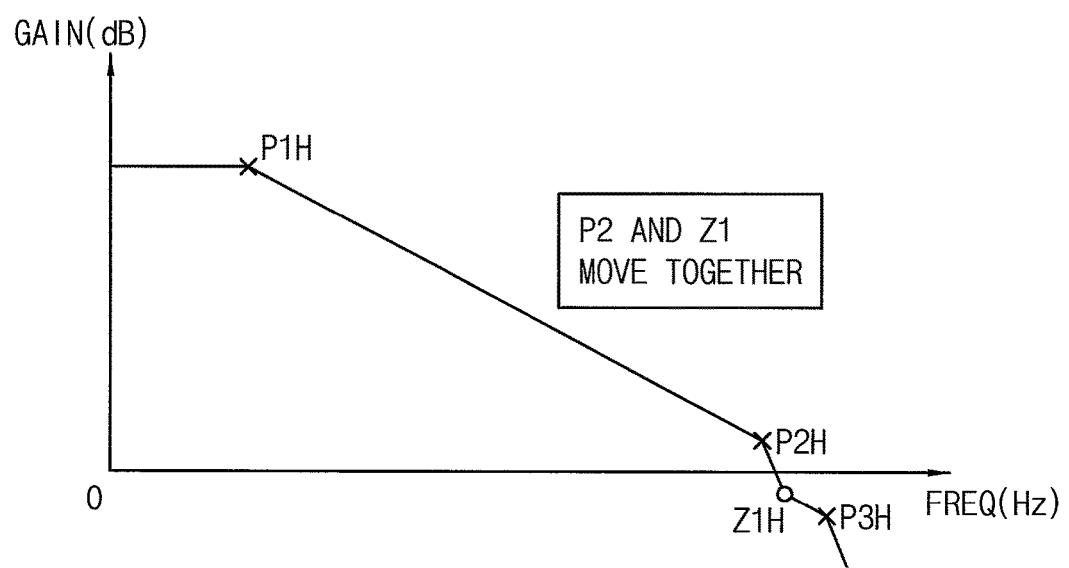
FIG. 6 illustrates a frequency characteristic curve of the regulator circuit when the stabilizer changes a zero rapidly.

FIG. 6 illustrates a frequency characteristic curve of the regulator circuit 100 when the stabilizer 150 changes the zero Z1 rapidly according to the ripple of the output voltage VOUT based on the added current AC.

When the current of the load 190 is changed and the second dominant pole P2 is also changed, the second feedback circuit 160 generates the third feedback current FC3 corresponding to the ripple of the output voltage VOUT, and the stabilizer 150 may control the zero Z1 to chase the second dominant pole P2 rapidly based on the added current AC generated by adding the third feedback current FC3 and the first sensing current SC1. In this case, resonance phenomenon in the output voltage VOUT may be removed.

Figure 6A:
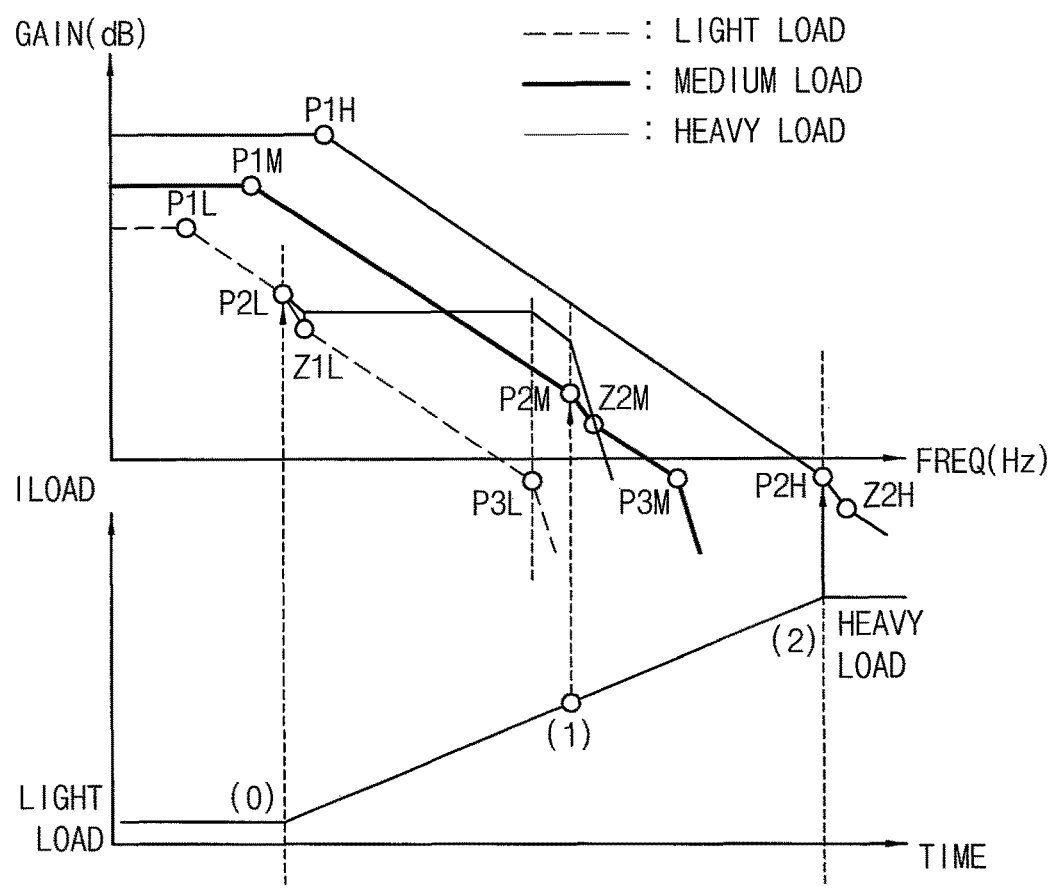
FIG. 6A is a graph illustrating movements of the zero and the dominant poles of FIGS. 4 through 6.

FIG. 6A is a graph illustrating movements of the zero and the dominant poles of FIGS. 4 through 6.

FIG. 6A may be understood with reference to FIGS. 4 through 6.

Figure 7:
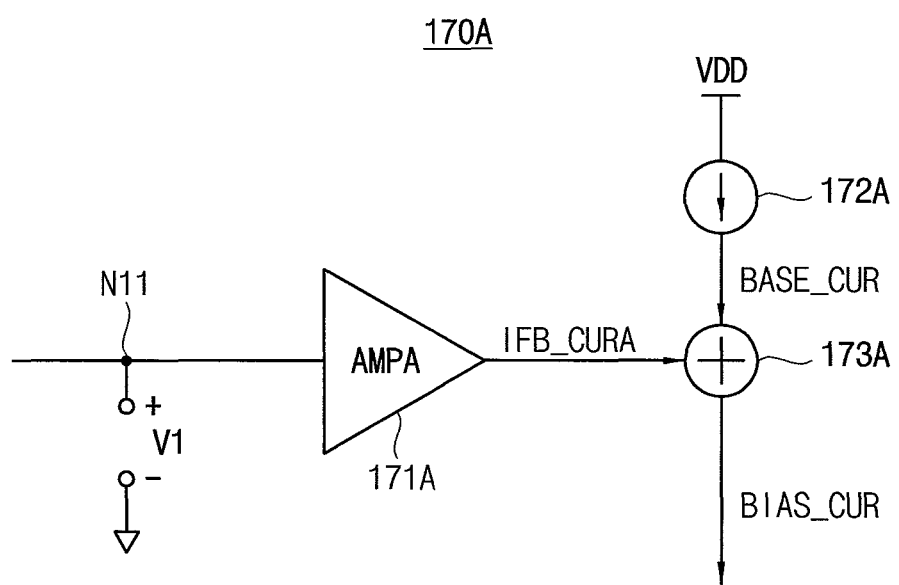
FIGS. 7 and 8 are circuit diagrams illustrating examples of the third feedback circuit in the regulator circuit of FIG. 1 according to example embodiments.
Figure 8:
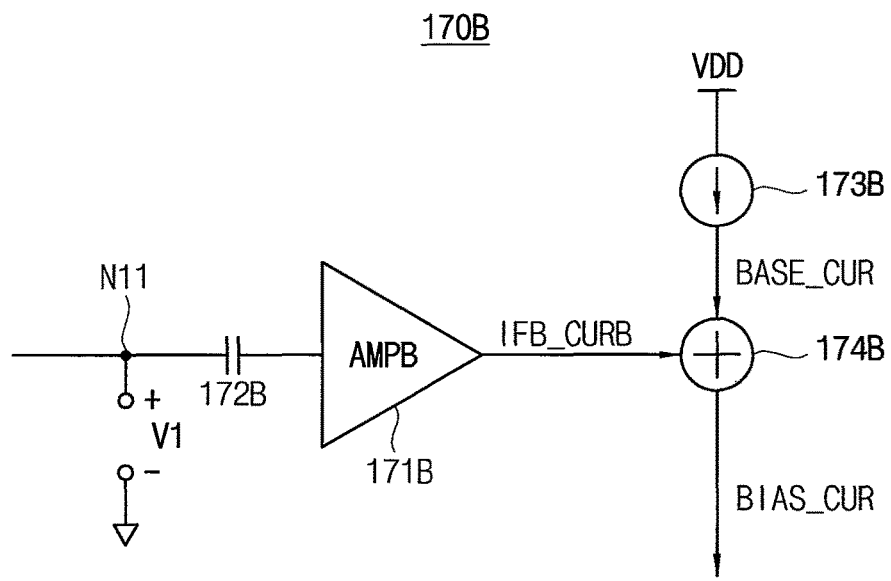

FIGS. 7 and 8 are circuit diagrams illustrating examples of the third feedback circuit in the regulator circuit of FIG. 1 according to example embodiments.

The regulator circuit 100 may further include a third feedback circuit 170 that generates a bias current BIAS_CUR based on the first voltage V1. The third feedback circuit 170 may provide the bias current BIAS_CUR to the operational amplifier 110, the buffer 120, and the second feedback circuit 160. If the output voltage VOUT is in an undershoot condition and the first voltage V1 increases, the third feedback circuit 170 may increase the bias current BIAS_CUR and the operational amplifier 110, the buffer 120, and the second feedback circuit 160 may accelerate a speed at which the undershoot condition is reduced by increasing an output current in response to the increased bias current BIAS_CUR.

Referring to FIG. 7, a third feedback circuit 170A may include an amplifier 171A, a current source 172A, and a current adder 173A. An input terminal of the amplifier 171A may receive the first voltage V1, and an output terminal of the amplifier 171A may output an internal feedback current IFB_CURA. The current source 172A may generate a base current BASE_CUR. The current adder 173A may generate the bias current BIAS_CUR by adding the base current BASE_CUR and an internal feedback current IFB_CURA.

Referring to FIG. 8, a third feedback circuit 170B may include an amplifier 171B, a capacitor 172B, a current source 173B, and a current adder 174B. A first terminal of the capacitor 172B may receive the first voltage V1, a second terminal of the capacitor 172B may be connected to an input terminal of the amplifier 171B, and an output terminal of the amplifier 171B may output an internal feedback current IFB_CURB. The current source 173B may generate a base current BASE_CUR. The current adder 174B may generate the bias current BIAS_CUR by adding the base current BASE_CUR and the internal feedback current IFB_CURB.

The capacitor 172B may couple the first voltage V1 and a voltage of the input terminal of the amplifier 171B. In other words, an alternating current (AC) component of the first voltage V1 may be transferred to the input terminal of the amplifier 171B.

Figure 9:
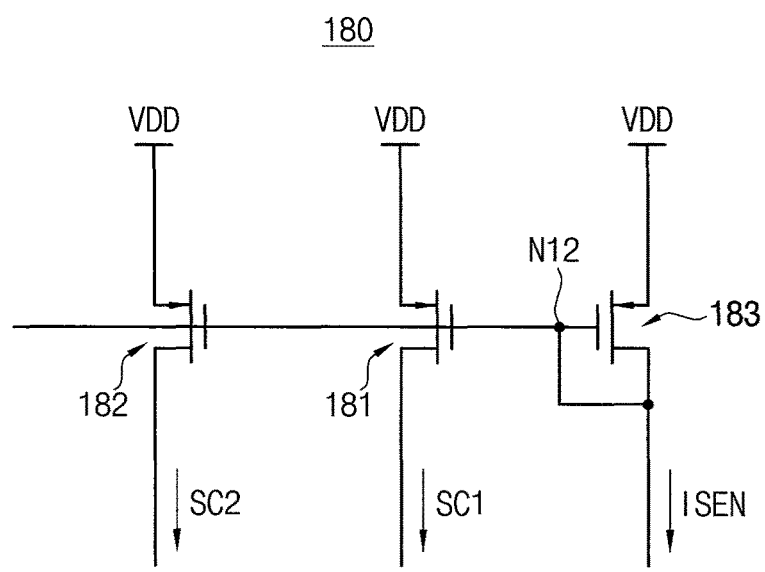
FIG. 9 is a circuit diagram illustrating the current sensor in the regulator circuit of FIG. 1 according to example embodiments.

FIG. 9 is a circuit diagram illustrating the current sensor in the regulator circuit of FIG. 1 according to example embodiments.

Referring to FIG. 9, the current sensor 180 may include first through third sensing transistors 181, 182 and 183.

A source of the first sensing transistor 181 receives the supply voltage VDD, a gate of the first sensing transistor 181 is connected to the second node N12, and a drain of the first sensing transistor 181 may output the first sensing current SC1. A source of the second sensing transistor 182 receives the supply voltage VDD, a gate of the second sensing transistor 182 is connected to the second node N12, and a drain of the second sensing transistor 182 outputs the second sensing current SC2. A source of the third sensing transistor 183 receives the supply voltage VDD, a gate of the third sensing transistor 183 is connected to the second node N12, and a drain of the third sensing transistor 182 is connected to the second node N12. The sensing current ISEN which is outputted from the drain of the third sensing transistor 183 is proportional to the load current ILOAD which is outputted from the source of the power transistor 130.

The first sensing current SC1 and the second sensing current SC2 may be proportional to the sensing current ISEN. A ratio of the sensing current ISEN and the first and second sensing currents SC1 and SC2 may correspond to a ratio of a width/length (W/L) ratio of the third sense transistor 183 and a W/L ratio of the first and second sense transistors 181 and 182.

Figure 10:
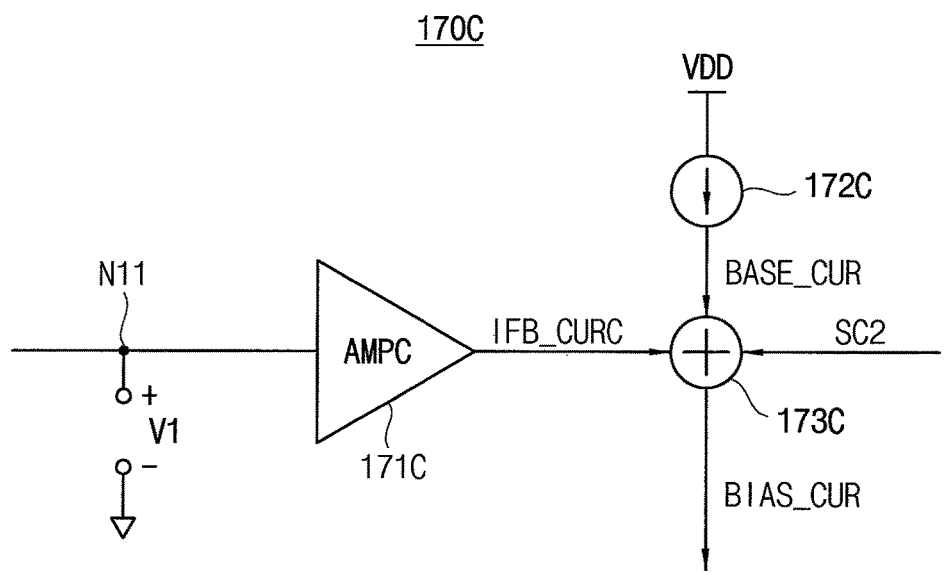
FIGS. 10 and 11 are circuit diagrams illustrating examples of the third feedback circuit in the regulator circuit of FIG. 1 according to example embodiments.
Figure 11:
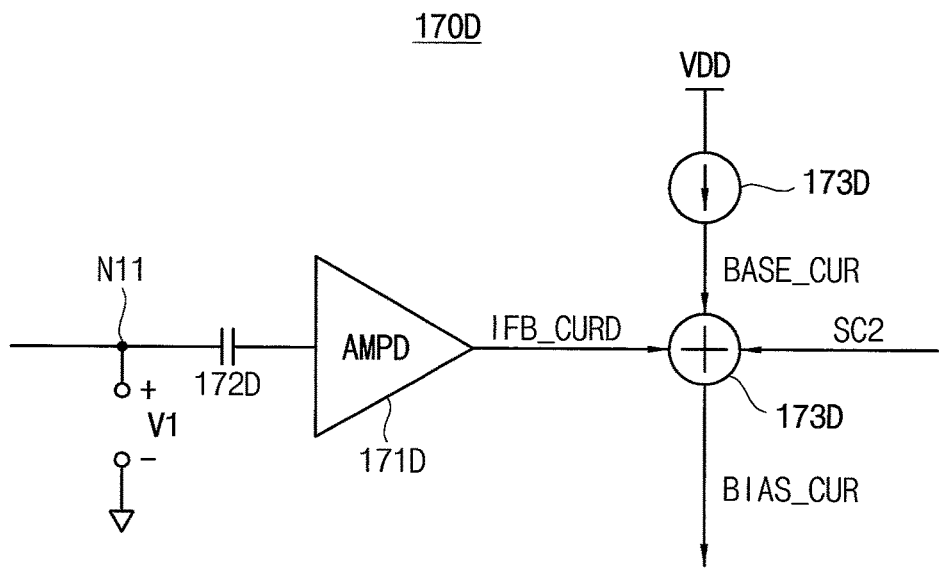

FIGS. 10 and 11 are circuit diagrams illustrating examples of the third feedback circuit in the regulator circuit of FIG. 1 according to example embodiments.

The regulator circuit 100 may further include the third feedback circuit 170 which generates the bias current BIAS_CUR based on the first voltage V1 and the second sensing current SC2, and provides the bias current BIAS_CUR to the operational amplifier 110, the buffer 120, and the second feedback circuit 160. If the output voltage VOUT is in an undershoot condition, the first voltage V1 increases and the second sensing current SC2 increases, the third feedback circuit 170 may increase the bias current BIAS_CUR and the operational amplifier 110, the buffer 120, and the second feedback circuit 160 may accelerate a speed at which the undershoot condition is reduced by increasing an output current in response to the increased bias current BIAS_CUR.

Referring to FIG. 10, a third feedback circuit 170C may include an amplifier 171C, a current source 172C, and a current adder 173C. An input terminal of the amplifier 171C may receive the first voltage V1 and an output terminal of the amplifier 171C may output an internal feedback current IFB_CURC. The current source 172C may generate a base current BASE_CUR. The current adder 173C may generate the bias current BIAS_CUR by adding the base current BASE_CUR, the second sensing current SC2, and the internal feedback current IFB_CURC.

Referring to FIG. 11, a third feedback circuit 170D may include an amplifier 171D, a capacitor 172D, a current source 173D, and a current adder 173D. A first terminal of the capacitor 172D may receive the first voltage V1, a second terminal of the capacitor 172D may be connected to an input terminal of the amplifier 171D, and an output terminal of the amplifier 171D may output an internal feedback current IFB_CURD. The current source 173D may generate the base current BASE_CUR. The current adder 174D may generate the bias current BIAS_CUR by adding the base current BASE_CUR, the second sensing current SC2, and the internal feedback current IFB_CURD.

The capacitor 172D may couple the first voltage V1 and a voltage of the input terminal of the amplifier 171D. In other words, an AC component of the first voltage V1 may be transferred to the input terminal of the amplifier 171D.

Figure 12:
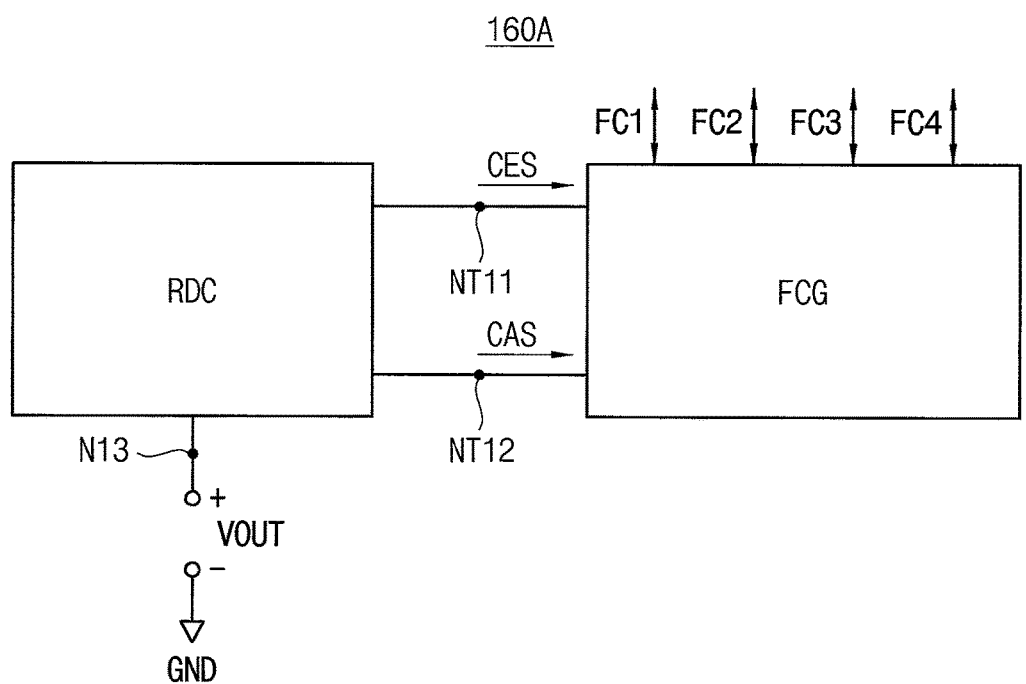
FIG. 12 is a block diagram illustrating an example of the second feedback circuit in the regulator circuit of FIG. 1 according to example embodiments.

FIG. 12 is a block diagram illustrating an example of the second feedback circuit in the regulator circuit of FIG. 1 according to example embodiments.

Referring to FIG. 12, a second feedback circuit 160A may include a ripple detector RDC and a feedback current generator FCG. The ripple detector RDC may output a first current control signal CES and a second current control signal CAS, which are generated based on the output voltage VOUT, through a first internal node NT11 and a second internal node NT12 respectively. The ripple detector RDC may activate the first current control signal CES when the ripple is in an undershoot condition. The ripple detector RDC may activate the second current control signal CAS when the ripple is in an overshoot condition. Example embodiments of the ripple detector RDA will be described with reference to FIGS. 13 and 14.

The feedback current generator FCG may generate the first through fourth feedback currents FC1, FC2, FC3, and FC4 based on the first current control signal CES and the second current control signal CAS. The feedback current generator FCG may generate the first through fourth feedback currents FC1, FC2, FC3, and FC4 having positive values when the first current control signal CES is activated. The feedback current generator FCG may generate the first through fourth feedback currents FC1, FC2, FC3, and FC4 having negative values when the second current control signal CAS is activated. The feedback current generator FCG will be described with reference to FIG. 15.

The second feedback circuit 160 may be implemented with a structure other than the structure illustrated in FIG. 12.

Figure 13:
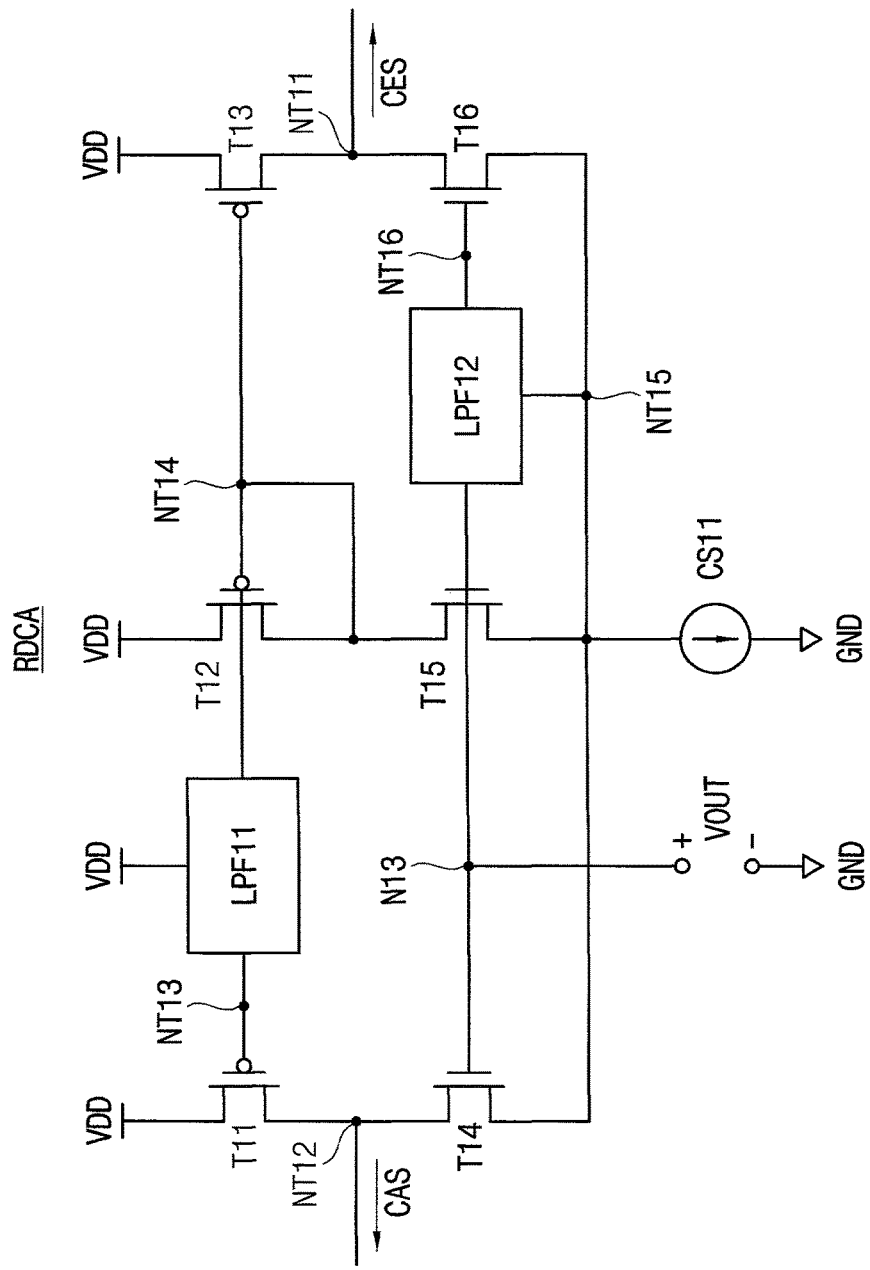
FIGS. 13 and 14 are block diagrams illustrating examples of the ripple detector in the second feedback circuit of FIG. 12 according to example embodiments.
Figure 14:
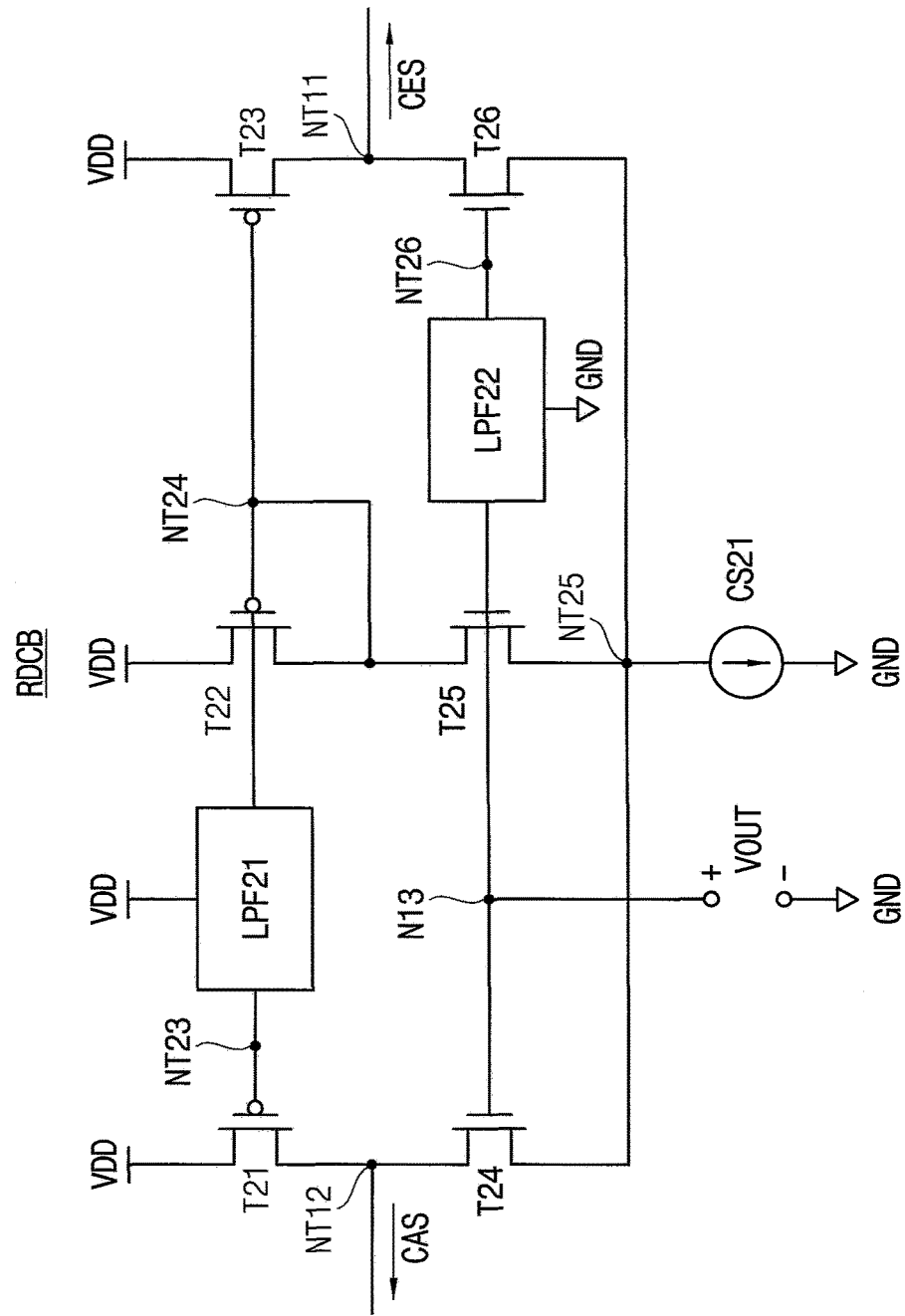

FIGS. 13 and 14 are block diagrams illustrating examples of the ripple detector in the second feedback circuit of FIG. 12 according to example embodiments.

Referring to FIG. 13, a ripple detector RDCA may include first through third PMOS transistors T11, T12, and T13, first and second low-pass filters LPF11 and LPF12, first through third NMOS transistors T14, T15, and T16, and a current source CS11.

The first PMOS transistor T11 may include a source receiving the supply voltage VDD, a gate connected to a third internal node NT13, and a drain connected to the second internal node NT12. The second current control signal CAS may be outputted from the second internal node NT12. The first low-pass filter LPF11 may be connected to the third internal node NT13 and a fourth internal node NT14. The second PMOS transistor T12 may include a source receiving the supply voltage VDD, a gate connected to the fourth internal node NT14, and a drain connected to the fourth internal node NT14. The third PMOS transistor T13 may include a source receiving the supply voltage VDD, a gate connected to the fourth internal node NT14, and a drain terminal to the first internal node NT11. The first current control signal CES may be outputted from the first internal node NT11. The first low-pass filter LPF11 is well-known to the ordinary skilled artisan, and thus a detailed internal description of the first low-pass filter LPF11 is omitted herein.

The first and second PMOS transistors T11 and T12 form a first current mirror structure and the second and third PMOS transistors T12 and T13 form a second current mirror structure. In an example embodiment, width/length (W/L) ratios (or aspect ratios) of the first and third PMOS transistors T11 and T13 may be K-times bigger than aspect ratio of the second PMOS transistor T12. K may be a rational number bigger than 1. In other words, current driving power of the first and third PMOS transistor T11 and T13 may be K-times bigger than a current driving power of the second PMOS transistor T12. In this case, when a resistance between drain and source of the first and third PMOS transistors T11 and T13 decreases, voltages of the first and second internal nodes NT11 and NT12 become close to the supply voltage VDD, and the first and third PMOS transistors T11 and T13 may mostly operate in the linear region.

The first NMOS transistor T14 may include a drain connected to the second internal node NT12, a gate connected to the third node N13, and a source connected to a fifth internal node NT15. The second NMOS transistor T15 may include a drain connected to the fourth internal node NT14, a gate connected to the third node N13, and a source connected to the fifth internal node NT15. The second low-pass filter LPF12 may be connected to the third node N13, the fifth internal node NT15 and a sixth internal node NT16. The third NMOS transistor T16 may include a drain connected to the first internal node NT11, a gate connected to the sixth internal node NT16, and a source connected to the fifth internal node NT15. The current source CS11 may include a first terminal connected to the fifth internal node NT15 and a second terminal connected to the ground voltage GND. In an example embodiment, W/L ratios of the first through third NMOS transistors T14, T15 and T16 may be the same with respect to each other. The second low-pass filter LPF12 is well-known to the ordinary skilled artisan, and thus a detailed internal description of the second low-pass filter LPF12 is omitted herein.

In a case when the output voltage VOUT has a transient falling ripple, in other words, when the ripple of the output voltage VOUT is in an undershoot condition, a resistance between the drain and the source of the second NMOS transistor T15 increases and a voltage of the fourth internal node NT14 increases because a gate voltage of the second NMOS transistor T15 decreases. The falling ripple of the output voltage VOUT has a higher frequency component and voltage rising ripple of the fourth internal node NT14 also has a high frequency component. The voltage rising ripple of the fourth internal node NT14 is filtered by the first low-pass filter LPF11, and is not transferred to the third internal node NT13. Because a gate voltage of the first NMOS transistor T14 decreases, a resistance between the drain and the source of the first NMOS transistor T14 increases and a voltage of the second internal node NT12 increases with K-times larger margin than a falling margin of the output voltage VOUT through the large current driving power of the first PMOS transistor T11, and the second current control signal CAS is deactivated. Because the gate voltage of the third PMOS transistor T13 increases, a resistance between the drain and the source of the third PMOS transistor T13 increases and a voltage of the first internal node NT11 decreases with K-times larger margin than a falling margin of the output voltage VOUT through the large current driving power of the third PMOS transistor T13, and the first current control signal CES is activated.

In a case when the output voltage VOUT has a transient rising ripple, in other words, the ripple of the output voltage VOUT is in an overshoot condition, a resistance between the drain and the source of the second NMOS transistor T15 decreases and a voltage of the fourth internal node NT14 decreases because a gate voltage of the second NMOS transistor T15 increases. The rising ripple of the output voltage VOUT has a higher frequency component and a voltage falling ripple of the fourth internal node NT14 also has a higher frequency component. The voltage falling ripple of the fourth internal node NT14 is filtered by the first low-pass filter LPF11 and is not transferred to the third internal node NT13. Because a gate terminal voltage of the first NMOS transistor T14 increases, a resistance between the drain and the source of the first NMOS transistor T14 decreases and a voltage of the second internal node NT12 decreases with K-times larger margin than a rising margin of the output voltage VOUT through the large current driving power of the first PMOS transistor T11, and the second current control signal CAS is activated. Because the gate terminal voltage of the third PMOS transistor T13 decreases, a resistance between the drain and the source of the third PMOS transistor T13 decreases and a voltage of the first internal node NT11 increases with K-times larger margin than a rising margin of the output voltage VOUT through the large current driving power of the third PMOS transistor T13, and the first current control signal CES is deactivated.

Referring to FIG. 14, a ripple detector RDCB has the same structure with the ripple detector RDCA of FIG. 13 except a connection of a second low-pass filter LPF22. The second low-pass filter LPF22 may be connected to the third node N13, the ground voltage GND node and the sixth internal node NT26. The second low-pass filter LPF22 is well-known to the ordinary skilled artisan, and thus a detailed internal description of the second low-pass filter LPF22 is omitted herein. Transistors T21, T22, T23, T24, T25, and T26 of FIG. 14 corresponds respectively to transistors T11, T12, T13, T14, T15, and T16 of FIG. 13. Nodes NT11, NT12, N13, NT23, NT24, NT25, and NT26 of FIG. 14 correspond respectively to nodes NT11, NT12, N13, NT13, NT14, NT15, and NT16 of FIG. 13. Low-pass filter LPF21 and current source CS21 of FIG. 14 correspond respectively to low-pass filter LPF11 and current source CS11 of FIG. 13.

The ripple detector RDC may be embodied with a structure other than the structures of the ripple detectors RDCA of FIG. 13 and RDCB of FIG. 14.

Figure 15:
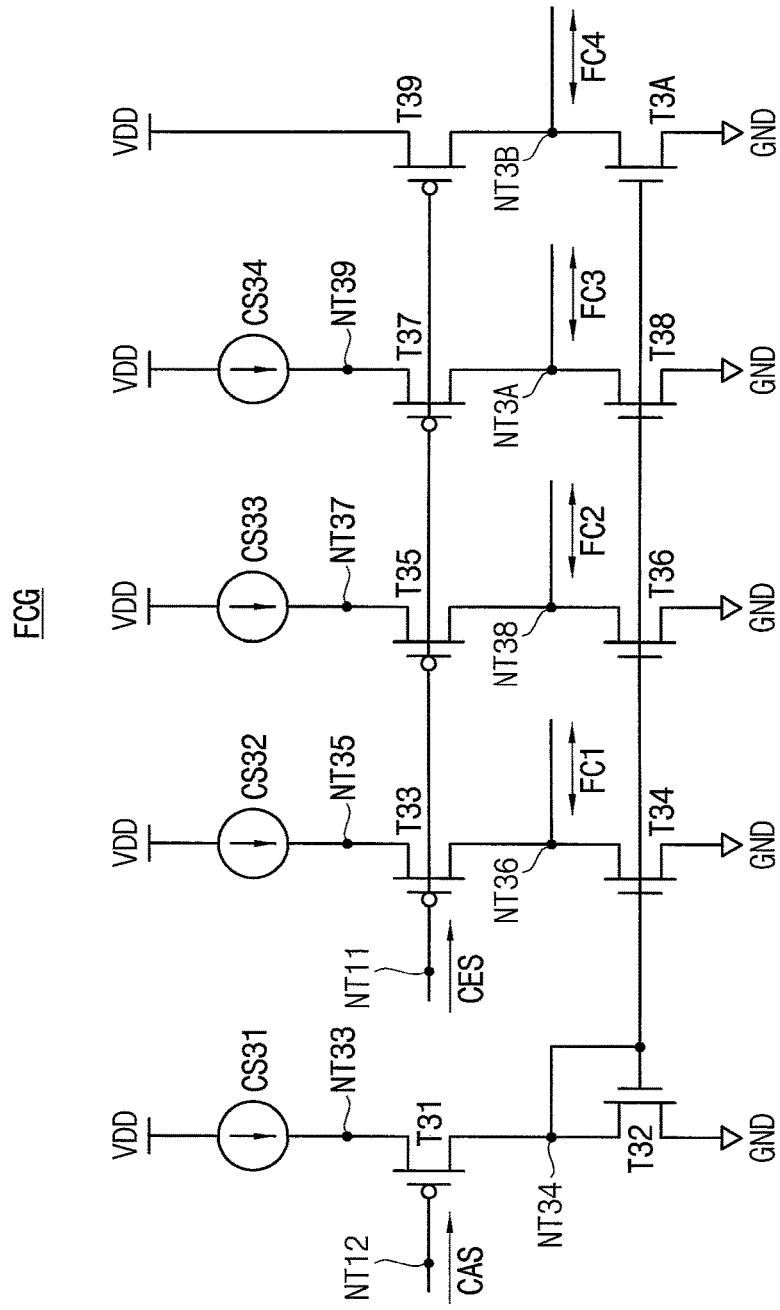
FIG. 15 is a circuit diagram illustrating the feedback current generator in the second feedback circuit of FIG. 12 according to example embodiments.

FIG. 15 is a circuit diagram illustrating the feedback current generator in the second feedback circuit of FIG. 12 according to example embodiments.

Referring to FIG. 15, the feedback current generator FCG may include first through fourth current sources CS31, CS32, CS33 and CS34, first through fifth PMOS transistors T31, T33, T35, T37, and T39, and first through fifth NMOS transistors T32, T34, T36, T38, and T3A.

The first current source CS31 includes a first terminal receiving the supply voltage VDD and a second terminal connected to a third internal node NT33. The first PMOS transistor T31 includes a source connected to the third internal node NT33, a gate connected to the second internal node NT12, and a drain connected to a fourth internal node NT34. The first NMOS transistor T32 includes a source connected to the ground voltage GND, a gate connected to a fourth internal node NT34, and a drain connected to the fourth internal node NT34.

The second current source CS32 includes a first terminal receiving the supply voltage VDD and a second terminal connected to the fifth internal node NT35. The second PMOS transistor T33 includes a source connected to the fifth internal node NT35, a gate connected to the first internal node NT11, and a drain connected to a sixth internal node NT36 from which the first feedback current FC1 is output. The second NMOS transistor T34 includes a source connected to the ground voltage GND, a gate connected to the fourth internal node NT34, and a drain connected to the sixth internal node NT36.

The third current source CS33 includes a first terminal receiving the supply voltage VDD and a second terminal connected to a seventh internal node NT37. The third PMOS transistor T35 includes a source connected to the seventh internal node NT37, a gate connected to the first internal node NT11, and a drain connected to an eighth internal node NT38 from which the second feedback current FC2 is output. The third NMOS transistor T36 includes a source connected to the ground voltage GND, a gate connected to the fourth internal node NT34, and a drain connected to the eighth internal node NT38.

The fourth current source CS34 includes a first terminal receiving the supply voltage VDD and a second terminal connected to a ninth internal node NT39. The fourth PMOS transistor T37 includes a source connected to the ninth internal node NT39, a gate connected to the first internal node NT11, and a drain connected to a tenth internal node NT3A from which the third feedback current FC3 is output. The fourth NMOS transistor T38 includes a source connected the ground voltage GND, a gate connected to the fourth internal node NT34, and a drain connected to the tenth internal node NT3A.

The fifth PMOS transistor T39 includes a source receiving the supply voltage VDD, a gate connected to the first internal node NT11, and a drain connected to an eleventh internal node NT3B from which the fourth feedback current FC4 is output. The fifth NMOS transistor T3A includes a source connected the ground voltage GND, a gate connected to the fourth internal node NT34, and a drain connected to the eleventh internal node NT3B.

When the first current control signal CES is activated, the second through fifth PMOS transistors T33, T35, T37, and T39 may drive the first through fourth feedback currents FC1, FC2, FC3, and FC4 as positive values. In other words, when the first current control signal CES is activated, the second through fifth PMOS transistors T33, T35, T37, and T39 may output the first through fourth feedback currents FC1, FC2, FC3, and FC4 to the outside.

When the second current control signal CAS is activated, the second through fifth NMOS transistors T34, T36, T38, and T3A may drive the first through fourth feedback currents FC1, FC2, FC3, and FC4 as negative values. In other words, when the second current control signal CAS is activated, the second through fifth NMOS transistors T34, T36, T38, and T3A may pull the first through fourth feedback currents FC1, FC2, FC3, and FC4 from the outside.

In an example embodiment, the second through fourth current sources CS32, CS33, and CS34 may be not included in the feedback current generator FCG. In other words, a source of the second PMOS transistor T33 may receive the supply voltage VDD, a source of the third PMOS transistor T35 may receive the supply voltage VDD, and a source of the fourth PMOS transistor T37 may receive the supply voltage VDD.

The feedback current generator FCG may be embodied by a structure other than the structure illustrated in FIG. 15.

Figure 16:
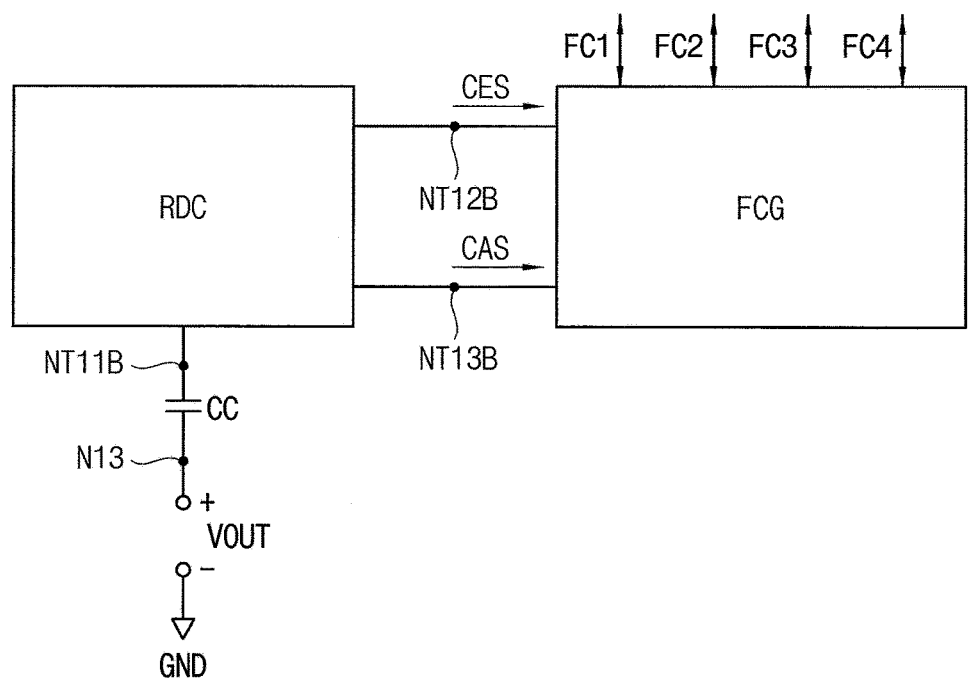
FIG. 16 is a block diagram illustrating another example of the second feedback circuit in the regulator circuit of FIG. 1 according to example embodiments.

FIG. 16 is a block diagram illustrating another example of the second feedback circuit in the regulator circuit of FIG. 1 according to example embodiments.

Referring to FIG. 16, a second feedback circuit 160B may include a capacitor CC, a ripple detector RDC, and a feedback current generator FCG.

The capacitor CC may include a first terminal receiving the output voltage VOUT, and a second terminal connected to a first internal node NT11B. The ripple detector RDC may output a first current control signal CES and a second current control signal CAS, which are generated based on a voltage of the first internal node NT11B, through a second internal node NT12B and a third internal node NT13B respectively. The ripple detector RDC may activate the first current control signal CES when the ripple is in an undershoot condition. The ripple detector RDB may activate the second current control signal CAS when the ripple is in an overshoot condition. The feedback current generator FCG may generate the first through fourth feedback currents FC1, FC2, FC3, and FC4 based on the first current control signal CES and the second current control signal CAS.

The capacitor CC may couple the output voltage VOUT and the voltage of the first internal node NT11B. In other words, an AC component of the output voltage VOUT may be transferred to the first internal node NT11B.

The ripple detector RDC may have the same or similar structure with the ripple detector RDCA of FIG. 13 and the ripple detector RDCB of FIG. 14. The feedback current generator FCG may have the same or similar structure with the feedback current generator FCG of FIG. 15. The ripple detector RDC and the feedback current generator FCG may be understood with reference to FIGS. 13 through 15.

The second feedback circuit 160B may be embodied by a structure other than the structure illustrated in FIG. 16.

Figure 17:
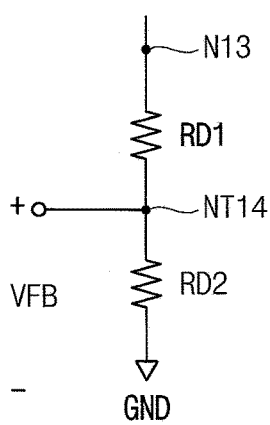
FIG. 17 is a circuit diagram illustrating the first feedback circuit in the regulator circuit of FIG. 1 according to example embodiments.

FIG. 17 is a circuit diagram illustrating the first feedback circuit in the regulator circuit of FIG. 1 according to example embodiments.

Referring to FIG. 17, the first feedback circuit 140 may include a first resistor RD1 and a second resistor RD2.

A first terminal of the first resistor RD1 may be connected to the third node N13 and a second terminal of the first resistor RD1 may be connected to an internal node NT14. A first terminal of the second resistor RD2 may be connected to the internal node NT14, a second terminal of the second resistor RD2 may be connected to the ground voltage GND, and a voltage of the internal node NT14 may correspond to the feedback voltage VFB.

Figure 18:
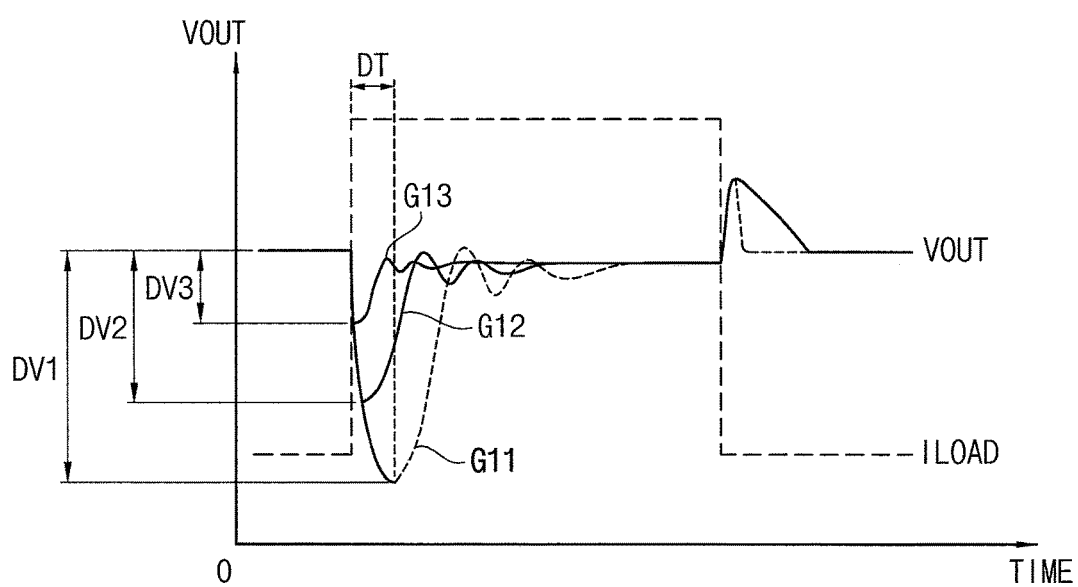
FIG. 18 is a timing diagram illustrating operation of the regulator circuit of FIG. 1.

FIG. 18 is a timing diagram illustrating the operation of the regulator circuit of FIG. 1.

Referring to FIG. 18, a first graph G11 shows a timing diagram of the output voltage VOUT when the load current ILOAD changes with a step pulse shape and the operational amplifier 110, the buffer 120, the power transistor 130 and the first feedback circuit 140 operate and other components do not operate in the regulator circuit 100. In the first graph G11, an undershoot of the output voltage VOUT is represented as a first voltage difference DV1 and a feedback delay DT of the output voltage VOUT is long.

A second graph G12 shows a timing diagram of the output voltage VOUT when the load current ILOAD changes with a step pulse shape and the third feedback circuit 170 does not operate, but other components operate in the regulator circuit 100. In the second graph G12, an undershoot of the output voltage VOUT is represented as a second voltage difference DV2, which is smaller than the first voltage difference DV1, and a feedback delay of the output voltage VOUT is shorter than the feedback delay DT of the first graph G11.

A third graph G13 shows a timing diagram of the output voltage VOUT when the load current ILOAD changes with a step pulse shape and all components of the regulator circuit 100 operate. In the third graph G13, an undershoot of the output voltage VOUT is represented as a third voltage difference DV3, which is smaller than the second voltage difference DV2, and a feedback delay of the output voltage VOUT is shorter than the feedback delay of the second graph G12.

Figure 19:
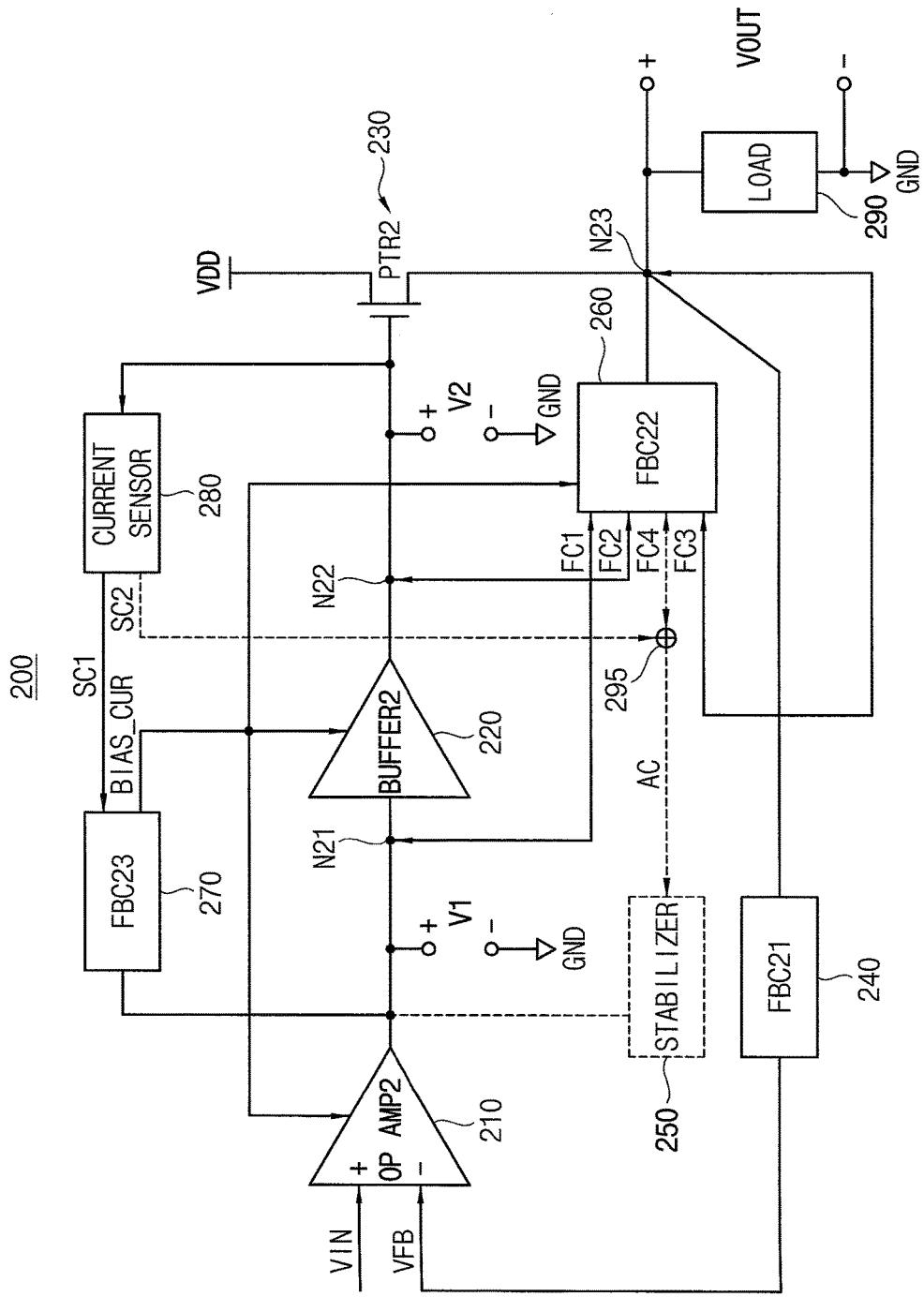
FIG. 19 is a block diagram illustrating a regulator circuit according to example embodiments.

FIG. 19 is a block diagram illustrating a regulator circuit according to example embodiments.

Referring to FIG. 19, a regulator circuit 200 includes an operational amplifier 210, a buffer 220, a power transistor 230, a first feedback circuit 240, a second feedback circuit 260, a third feedback circuit 270, a current sensor 280 and a load 290.

The operational amplifier 210 may drive a first node N21 with a first voltage V1 generated by amplifying a difference between VIN and a feedback voltage VFB. The buffer 220 may drive a second node N22 with a second voltage V2 generated by buffering the first voltage V1. The power transistor 230 may include a drain receiving a supply voltage VDD, a gate connected to the second node N22 and a source connected to a third node N23. The power transistor 230 may be implemented with an NMOS transistor. The first feedback circuit 240 may generate the feedback voltage VFB by voltage dividing an output voltage VOUT of the third node N23. The current sensor 280 may generate a first sensing current SC1 based on the second voltage V2. The second feedback circuit 260 may generate first through third feedback currents FC1, FC2 and FC3 corresponding to a ripple of the output voltage VOUT. The second feedback circuit 260 may provide the first and second feedback currents FC1 and FC2 to the first and second nodes N21 and N22 respectively. The second feedback circuit 260 may enhance a speed at which the ripple is reduced by providing the third feedback current FC3 to the third node N23. The third feedback circuit 270 may generate a bias current BIAS_CUR based on the first voltage V1 and the first sensing current SC1. The third feedback circuit 270 may provide the bias current BIAS_CUR to the operational amplifier 210, the buffer 220, and the second feedback circuit 260.

If the output voltage VOUT is in an undershoot condition, the first voltage V1 increases and the first sensing current SC1 increases, the third feedback circuit 270 may increase the bias current BIAS_CUR and the operational amplifier 210, the buffer 220, and the second feedback circuit 260 may accelerate a speed at which the undershoot condition is reduced by increasing an output current in response to the increased bias current BIAS_CUR.

In some embodiments, the current sensor 280 may further generate a second sensing current SC2 proportional to the first sensing current SC1. The second feedback circuit 260 may further generate a fourth feedback current FC4 proportional to the first through third feedback currents FC1, FC2, and FC3. The regulator circuit 200 may further include a stabilizer 250 that suppresses a resonance phenomenon in the output voltage VOUT based on an added current AC generated by adding the fourth feedback current FC4 and the second sensing current SC2 with an adder 295.

The operational amplifier 210, the buffer 220, the power transistor 230, the first feedback circuit 240, the second feedback circuit 260, the third feedback circuit 270, the current sensor 280, the stabilizer 250, and the load 290 of the regulator circuit 200 of FIG. 19 may have the same or similar structure with the operational amplifier 110, the buffer 120, the power transistor 130, the first feedback circuit 140, the second feedback circuit 160, the third feedback circuit 170, the current sensor 180, the stabilizer 150, and the load 190, respectively.

According to example embodiments, a regulator circuit 100 or 200 includes an operational amplifier 110 or 210, a buffer 120 or 220, a power transistor 130 or 230, a first feedback circuit 140 or 240, a current sensor 180 or 280 and a second feedback circuit 160 or 260.

The operational amplifier 110 or 210 drives a first node N11 or N21 with a first voltage V1 generated by amplifying a difference between VIN and a feedback voltage VFB. The buffer 120 or 220 drives a second node N12 or N22 with a second voltage V2 generated by buffering the first voltage V1. The power transistor 130 or 230 includes a drain receiving a supply voltage VDD, a gate connected to the second node N12 or N22, and a source connected to a third node N13 or N23. The power transistor 130 or 230 may be implemented with NMOS transistor.

The first feedback circuit 140 or 240 generates the feedback voltage VFB by voltage dividing an output voltage VOUT of the third node N13 or N23. The current sensor 180 or 280 generates a first sensing current SC1 based on the second voltage V2. The second feedback circuit 160 or 260 generates a plurality of feedback currents FC1, FC2, FC3, and FC4 or FC1, FC2 or FC3 corresponding to a ripple of the output voltage VOUT. The second feedback circuit 160 or 260 enhances a speed at which the ripple is reduced by providing at least one of the plurality of feedback currents FC1, FC2, FC3, and FC4 or FC1, FC2 or FC3.

Figure 20:
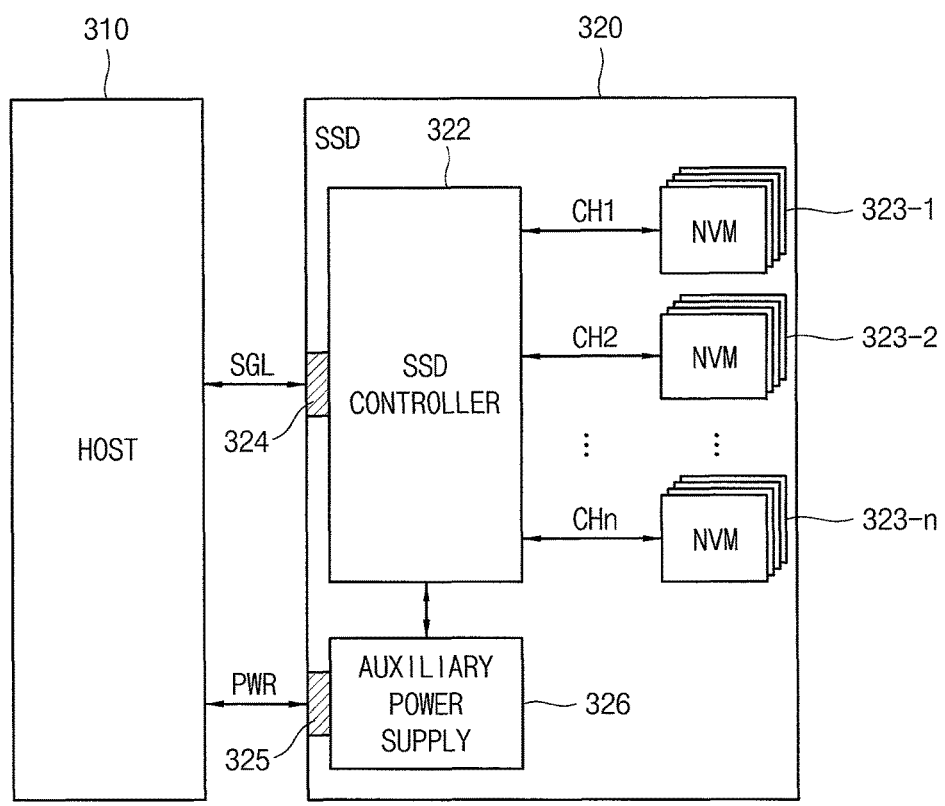
FIG. 20 is a block diagram illustrating a solid state drive system according to an example embodiment.

FIG. 20 is a block diagram illustrating a solid state drive system according to an example embodiment.

Referring to FIG. 20, a solid state drive (SSD) system 300 includes a host 310 and an SSD 320.

The SSD 320 includes first through n-th non-volatile memory devices 323-1, 323-2, ..., 323-n and an SSD controller 322. Here, n represents an integer equal to or greater than two.

The first through n-th non-volatile memory devices 323-1, 323-2, ..., 323-n may be used as a storage medium of the SSD 320.

Each of the first through n-th non-volatile memory devices 323-1, 323-2, ..., 323-n may include a memory cell array formed on a substrate in a three-dimensional structure. Memory cells included in the memory cell array may be formed in a direction perpendicular to the substrate. The memory cells included in the memory cell array may be connected to a plurality of word lines, which are stacked in a direction perpendicular to the substrate, and a plurality of bit lines, which are formed in a direction parallel to the substrate.

The SSD controller 322 is coupled to the first through n-th non-volatile memory devices 323-1, 323-2, ..., 323-n by first through n-th channels CH1, CH2, ..., CHn, respectively.

The SSD controller 322 may exchange a signal SGL with the host 310 through a signal connector 324. The signal SGL may include a command, an address and data. The SSD controller 322 may perform a program operation and a read operation on the first through n-th non-volatile memory devices 323-1, 323-2, ..., 323-n according to the command received from the host 310.

The SSD 320 may further include an auxiliary power supply 326. The auxiliary power supply 326 may receive power PWR from the host 310 through a power connector 325 and provide the power to the SSD controller 322. The auxiliary power supply 326 may be placed inside or outside the SSD 320. For example, the auxiliary power supply 326 may be placed in a main board and provide auxiliary power to the SSD 320. The auxiliary power supply 326 may include at least one of the regulator circuits 100 and 200 of FIGS. 1 and 19.

Figure 21:
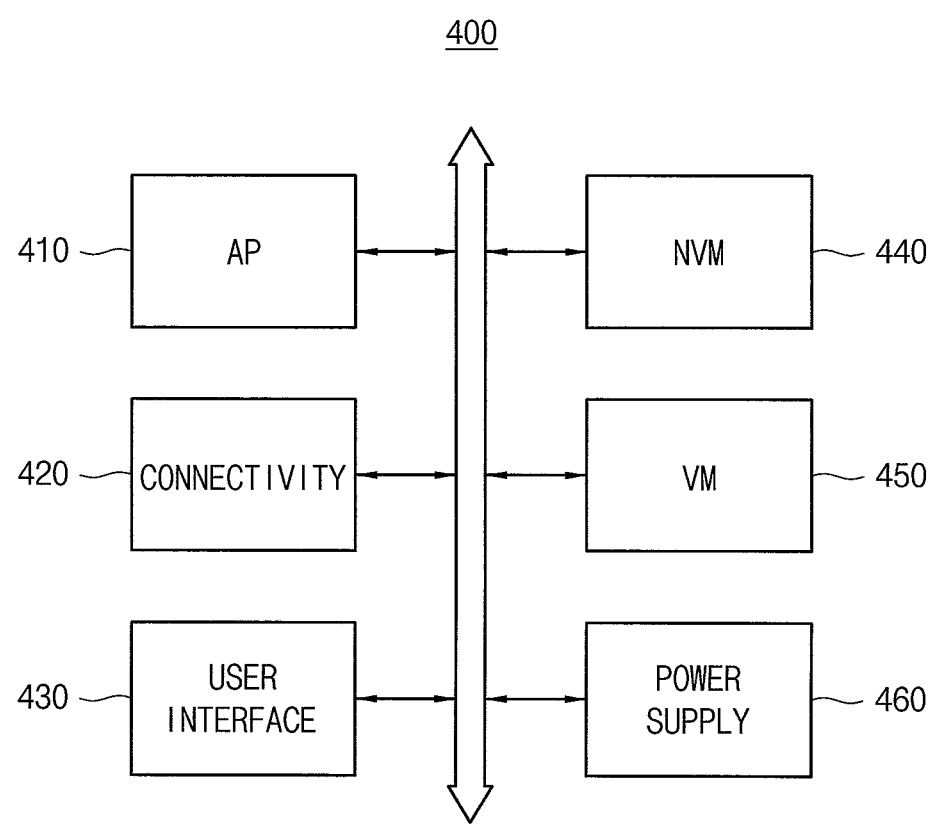
FIG. 21 is a block diagram illustrating a mobile system according to an example embodiment.

FIG. 21 is a block diagram illustrating a mobile system according to an example embodiment.

Referring to FIG. 21, a mobile system 400 includes an application processor AP 410, a connectivity unit 420, a user interface 430, a non-volatile memory device 440, a volatile memory device 450 and a power supply 460.

In some embodiments, the mobile system 400 may be a mobile phone, a smart phone, a personal digital assistant (PDA), a portable multimedia player (PMP), a digital camera, a music player, a portable game console, a navigation system, etc.

The application processor 410 may execute applications, such as a web browser, a game application, a video player, etc. In some example embodiments, the application processor 410 may include a single core or multiple cores. For example, the application processor 410 may be a multi-core processor, such as a dual-core processor, a quad-core processor, a hexa-core processor, etc. The application processor 410 may include an internal or external cache memory.

The connectivity unit 420 may perform wired or wireless communication with an external device. For example, the connectivity unit 420 may perform Ethernet communication, near field communication (NFC), radio frequency identification (RFID) communication, mobile telecommunication, memory card communication, universal serial bus (USB) communication, etc. In some embodiments, the connectivity unit 420 may include a baseband chipset that supports communications, such as global system for mobile communications (GSM), general packet radio service (GPRS), wideband code division multiple access (WCDMA), high speed downlink/uplink packet access (HSxPA), etc.

The non-volatile memory device 440 may store a boot image for booting the mobile system 400.

The non-volatile memory device 440 may include a memory cell array formed on a substrate in a three-dimensional structure. Memory cells included in the memory cell array may be formed in a direction perpendicular to the substrate. The memory cells included in the memory cell array may be connected to a plurality of word lines, which are stacked in a direction perpendicular to the substrate, and a plurality of bit lines, which are formed in a direction parallel to the substrate.

The volatile memory device 450 may store data processed by the application processor 410 or may operate as a working memory.

The user interface 430 may include at least one input device, such as a keypad, a touch screen, etc., and at least one output device, such as a speaker, a display device, etc.

The power supply 460 may supply a power supply voltage to the mobile system 400. The power supply 460 may include at least one of the regulator circuits 100 and 200 of FIGS. 1 and 19.

In some embodiments, the mobile system 400 may further include an image processor, and/or a storage device, such as a memory card, a solid state drive (SSD), a hard disk drive (HDD), a CD-ROM, etc.

In some embodiments, the mobile system 400 and/or components of the mobile system 400 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A regulator circuit comprising:
an operational amplifier configured to drive a first node with a first voltage generated by amplifying a difference between an input voltage and a feedback voltage;
a buffer configured to drive a second node with a second voltage generated by buffering the first voltage;
a power transistor having a drain receiving a supply voltage, a gate connected to the second node, and a source connected to a third node;
a first feedback circuit configured to generate the feedback voltage by voltage dividing an output voltage of the third node;
a current sensor configured to generate a first sensing current based on the second voltage;
a second feedback circuit configured to generate first through fourth feedback currents corresponding to a ripple of the output voltage, configured to provide a first current and the second feedback current to the first node and the second node respectively, and configured to increase a speed at which the ripple is reduced by providing the fourth feedback current to the third node; and
a stabilizer configured to suppress a resonance of the output voltage based on an added current generated by summing the third feedback current and the first sensing current.

2. The regulator circuit of claim 1, further comprising:
a load connected between the third node and a ground voltage, wherein:
the stabilizer provides a zero of the regulator circuit,
the load provides a pole of the regulator circuit, and
the stabilizer controls the zero to chase the pole based on the added current when the pole is changed according to a change of a current consumed by the load.

3. The regulator circuit of claim 1, wherein:
the stabilizer includes a resistor and a capacitor,
the resistor has a first terminal connected to the first node and a second terminal, the capacitor has a first terminal connected to the second terminal of the resistor and a second terminal connected to a ground voltage, and
a resistance of the resistor is changed based on the added current.

4. The regulator circuit of claim 1, further comprising a third feedback circuit configured to generate a bias current based on the first voltage and configured to provide the bias current to the operational amplifier, the buffer and the second feedback circuit.

5. The regulator circuit of claim 4, wherein:
the first voltage increases in response to the output voltage being in an undershoot condition with respect to an output voltage of the third node that is unaffected by the ripple,
the third feedback circuit increases the bias current in response to the increased first voltage, and
each of the buffer and the second feedback circuit increases an output current in response to the increased bias current such that a speed at which the undershoot condition is reduced is accelerated.

6. The regulator circuit of claim 4, wherein:
the third feedback circuit includes an amplifier, a current source, and a current adder,
the amplifier has an input terminal receiving the first voltage and an output terminal outputting an internal feedback current,
the current source generates a base current, and
the current adder generates the bias current by adding the base current and the internal feedback current.

7. The regulator circuit of claim 4, wherein:
the third feedback circuit includes an amplifier, a capacitor, a current source, and a current adder,
the capacitor has a first terminal receiving the first voltage and a second terminal coupled to an input terminal of the amplifier which has an output terminal outputting an internal feedback current,
the current source generates a base current, and
the current adder generates the bias current by adding the base current and the internal feedback current.

8. The regulator circuit of claim 1, wherein:
the current sensor further generates a second sensing current which is proportional to the first sensing current,
the first sensing current and the second sensing current are proportional to a current output from the source of the power transistor, and
the regulator circuit further includes a third feedback circuit which generates a bias current based on the first voltage and the second sensing current and provides the bias current to the operational amplifier, the buffer, and the second feedback circuit.

9. The regulator circuit of claim 8, wherein when the first voltage increases and the second sensing current increases in response to the output voltage being in an undershoot condition with respect to an output voltage of the third node that is unaffected by the ripple, the third feedback circuit increases the bias current and each of the buffer and the second feedback circuit increases an output current in response to the increased bias current such that a speed at which the undershoot condition is removed is accelerated.

10. The regulator circuit of claim 8, wherein:
the third feedback circuit includes an amplifier, a current source, and a current adder,
the amplifier has an input terminal receiving the first voltage and an output terminal outputting an internal feedback current,
the current source generates a base current, and
the current adder generates the bias current by adding the base current, the second sensing current and the internal feedback current.

11. The regulator circuit of claim 8, wherein:
the third feedback circuit includes an amplifier, a capacitor, a current source and a current adder,
the capacitor has a first terminal receiving the first voltage and a second terminal coupled to an input terminal of the amplifier which has an output terminal outputting an internal feedback current,
the current source generates a base current, and
the current adder generates the bias current by adding the base current, the second sensing current, and the internal feedback current.

12. The regulator circuit of claim 1, wherein:
the second feedback circuit comprises:
a ripple detector configured to generate a first current control signal and a second current control signal based on the output voltage and configured to output the first current control signal and the second current control signal respectively through a first internal node and a second internal node; and
a feedback current generator configured to generate the first through fourth feedback currents based on the first current control signal and the second current control signal, and
the ripple detector activates the first current control signal when the ripple is in an undershoot condition, with respect to an output voltage of the third node that is unaffected by the ripple, and activates the second current control signal when the ripple is in an overshoot condition.

13. The regulator circuit of claim 12, wherein:
the feedback current generator generates the first through fourth feedback currents having positive values when the first current control signal is activated, and
the feedback current generator generates the first through fourth feedback currents having negative values when the second current control signal is activated.

14. The regulator circuit of claim 1, wherein:
the second feedback circuit comprises:
a capacitor having a first terminal receiving the output voltage and a second terminal connected to a first internal node;
a ripple detector configured to generate a first current control signal and a second current control signal based on a voltage of the first internal node and configured to output the first current control signal and the second current control signal respectively through a second internal node and a third internal node; and
a feedback current generator configured to generate the first through fourth feedback currents based on the first current control signal and the second current control signal, and
the ripple detector activates the first current control signal when the ripple is in an undershoot condition, with respect to an output voltage of the third node that is unaffected by the ripple, and activates the second current control signal when the ripple is in an overshoot condition.

15. The regulator circuit of claim 1, wherein:
the first feedback circuit includes a first resistor and a second resistor,
the first resistor has a first terminal connected to the third node and a second terminal connected to an internal node, and
the second resistor has a first terminal connected to the internal node and a second terminal connected to a ground voltage and the feedback voltage is provided at the internal node.

16. A regulator circuit comprising:
an operational amplifier configured to drive a first node as a first voltage generated by comparing an input voltage and a feedback voltage;
a buffer configured to drive a second node with a second voltage generated by buffering the first voltage;
a power transistor including a drain receiving a supply voltage, a gate connected to the second node, and a source connected to a third node;
a first feedback circuit configured to generate the feedback voltage by dividing an output voltage of the third node;
a current sensor configured to generate a first sensing current based on the second voltage; and
a second feedback circuit configured to generate a plurality of feedback currents corresponding to a ripple of the output voltage, and configured to increase a speed at which the ripple is reduced by providing at least one of the plurality of feedback currents to the third node.

17. The regulator circuit of claim 16, further comprising a third feedback circuit configured to generate a bias current based on the first voltage and the first sensing current and configured to provide the bias current to the operational amplifier, the buffer, and the second feedback circuit.

18. A regulator circuit comprising:
an operational amplifier that generates a first voltage by amplifying a difference between an input voltage and a feedback voltage; and
a feedback circuit that generates a biasing current based on the first voltage generated by the operational amplifier and applies the biasing current to the operational amplifier to current bias the operational amplifier, wherein:
an undershoot condition of voltage ripple in an output of the regulator circuit, with respect to an output of the regulator circuit that is unaffected by the voltage ripple, causes the feedback circuit to increase the biasing current applied to the operational amplifier, and
the biasing current is generated based on an alternating current (AC) component, but not a direct current component, of the first voltage.

19. The regulator circuit of claim 18, further comprising:
a buffer circuit that buffers the first voltage so as to generate a second voltage, wherein
the feedback circuit generates the biasing current based on the first voltage and a current proportional to a current drawn from the regulator circuit by a load.

* * * * *